United States Patent
Kwon

(10) Patent No.: US 8,233,539 B2
(45) Date of Patent: Jul. 31, 2012

(54) METHOD AND APPARATUS FOR TRANSMITTING PACKET-BASED IMAGE FRAME

(75) Inventor: Se-an Kwon, Seoul (KR)

(73) Assignee: Samsung Electronics Co., Ltd., Suwon-Si (KR)

( * ) Notice: Subject to any disclaimer, the term of this patent is extended or adjusted under 35 U.S.C. 154(b) by 1267 days.

(21) Appl. No.: 11/876,951

(22) Filed: Oct. 23, 2007

(65) Prior Publication Data

US 2008/0232472 A1 Sep. 25, 2008

(30) Foreign Application Priority Data

Mar. 23, 2007 (KR) ........................ 10-2007-0028871

(51) Int. Cl.
*H04N 7/12* (2006.01)

(52) U.S. Cl. .......... 375/240.13; 375/240.15; 375/240.16

(58) Field of Classification Search ........................ None
See application file for complete search history.

(56) References Cited

U.S. PATENT DOCUMENTS

| | | | | |
|---|---|---|---|---|
| 5,903,313 A * | 5/1999 | Tucker et al. | ............ | 375/240.15 |
| 6,052,814 A * | 4/2000 | Karasawa | ..................... | 714/755 |
| 6,317,462 B1 * | 11/2001 | Boyce | ..................... | 375/240.27 |
| 2002/0085637 A1 * | 7/2002 | Henning | ..................... | 375/240.14 |
| 2004/0057465 A1 * | 3/2004 | Chen et al. | ..................... | 370/474 |
| 2004/0218673 A1 * | 11/2004 | Wang et al. | .............. | 375/240.12 |
| 2005/0157800 A1 * | 7/2005 | Kim | ......................... | 375/240.27 |
| 2006/0092893 A1 * | 5/2006 | Champion et al. | ............ | 370/338 |
| 2006/0146940 A1 | 7/2006 | Gomila et al. | | |
| 2007/0014354 A1 * | 1/2007 | Murakami et al. | ........ | 375/240.08 |

FOREIGN PATENT DOCUMENTS

KR 10-2003-0008685 1/2003

OTHER PUBLICATIONS

Chinese Office Action issued Apr. 26, 2011 in corresponding Chinese Patent Application 200810088132.9.
Korean Notice of Allowance for corresponding Korean Patent Application No. 10-2007-0028871 dated Dec. 5, 2011.

* cited by examiner

*Primary Examiner* — Anh-Vu Ly
*Assistant Examiner* — Andrew Oh
(74) *Attorney, Agent, or Firm* — Staas & Halsey LLP

(57) ABSTRACT

A method and apparatus for transmitting a packet-based image frame, the method including: dividing an input image into intra and inter prediction frames and encoding the intra and inter prediction frames; applying different error resilience algorithms to the intra and inter prediction frames; and performing forward error correction (FEC) on the intra and inter prediction frames according to the corresponding error resilience algorithms. According to aspects of the present invention, optimal error correction may be performed in accordance with characteristics of frames when image data is transmitted. Thus, a strong image streaming service for preventing errors of a mobile environment may be implemented simply and efficiently.

19 Claims, 8 Drawing Sheets

METHOD AND APPARATUS FOR TRANSMITTING PACKET-BASED IMAGE FRAME

CROSS-REFERENCE TO RELATED APPLICATION

This application claims the benefit of Korean Application No. 2007-28871, filed on Mar. 23, 2007 in the Korean Intellectual Property Office, the disclosure of which is incorporated herein by reference.

BACKGROUND OF THE INVENTION

1. Field of the Invention

Aspects of the present invention relate to a method and apparatus for transmitting a packet-based image frame, and more particularly, to a method and apparatus for transmitting an image frame by dividing an input image into intra and inter prediction frames, applying different error resilience algorithms to the intra and inter prediction frames, and performing forward error correction (FEC) on each frame.

2. Description of the Related Art

In a wired or wireless environment, a communication channel changes as time passes and a burst error frequently occurs while streaming video. Therefore, quality of service (QoS) or quality of experience (QoE) for video data may not be easily assured.

Furthermore, in general, presentation time for the video data in a reception terminal is restricted in a real-time streaming system in which data is input and output within a predetermined time. Also, presentation time for the video data in a reception terminal is restricted by a system operation (such as a mutual operation) with an external device that operates within a predetermined time and depends on temporal characteristics. Thus, the QoS by an automatic repeat-request (ARQ) may also not be easily assured.

Accordingly, a variety of methods of preventing errors from occurring when audio/video (A/V) data is transmitted in an error channel environment have been proposed. In particular, these methods are most applicable in a mobile environment (such as Internet protocol television (IPTV) and mobile television (TV)) in which video streaming data is transmitted based on an Internet protocol (IP) network.

In a packet-based network environment, forward error correction (FEC) is an algorithm that encodes transmission data to allow an error of the data to be both detectable and correctable. Thus, a reception terminal may perform error correction on the data. In general, when an error occurs in the network environment, the reception terminal performs an ARQ. However, most A/V data, such as streaming data, is transmitted in accordance with a remote desktop protocol (RDP) or a user datagram protocol (UDP), thus preventing the ARQ from being performed. Although the A/V data may be retransmitted, if a packet arrives later than the time it is to be displayed, the packet is effectively a lost packet. As described above, the FEC is performed when retransmission of data is not allowed or useless.

FIG. 1 is a diagram illustrating a conventional method of transmitting an image frame. Referring to FIG. 1, a network system includes a transmission terminal 110 and a reception terminal 120. In the transmission terminal 110, when an image source 111 inputs an image, an image encoder 112 encodes the input image. Then, a packet processing unit 113 packets the encoded image data according to a real-time transport protocol (RTP) in order to transmit the encoded image data. Next, an FEC processing unit 114 inserts codes required for error correction into the image data before the image data is externally transmitted through a network interface unit 115. An inverse process is performed in the reception terminal 120. The inverse process is performed from a network interface unit 121 to an FEC processing unit 122 to a packet processing unit 123 to an image decoder 124. Lastly, the image data is reproduced by a display unit 125.

In this case, the image encoder 112 of the transmission terminal 110 may perform motion prediction on N number of neighboring image data blocks and control an intra-updating rate by receiving reports about a network channel environment. The intra updating is an algorithm that performs intra-coding on a few macroblocks in order to prevent an error from propagating between transmitted frames.

The FEC processing unit 114 may determine an FEC encoding type by receiving reports about motions between frames and the network channel environment. In a conventional transmission method, an intra-updating rate and an FEC type that are fixed by using an operation table predetermined in accordance with a bit rate, a packet loss rate, and a burst error length are applied.

However, the above-described conventional method has the following problems. First, the conventional method does not consider an error resilience algorithm applied to a video encoder (in particular, H. 264 technology). The error resilience algorithms include: a redundant slice method in which redundant data is transmitted in slice units; an intra refresh method in which intra-coding is performed in accordance with a previously defined standard; a spare picture method in which, if a macroblock similar to a macroblock having an error exists in a reference picture, restoration is performed by using a picture including the corresponding macroblock; a flexible macroblock ordering (FMO) method in which a picture is divided into eight or less slice groups; a multiple reference picture method in which error propagation is prevented by selecting from among a plurality of reference images; a draft noise modeling method in which a propagation procedure of a noise is modeled based on an error rate; and a multiple decoding method in which an encoder statistically calculates an error on the assumption of a plurality of decoders.

In general, a structure of a group of pictures (GOP) in video data transmission is that a plurality of P frames are disposed after an I frame, and the I frame is frequently arranged at predetermined intervals. Here, an I frame and a P frame have completely different characteristics. Thus, error correction must be appropriately performed according to the characteristics of the I and P frames.

Furthermore, the conventional method is focused on real-time transmission and is not appropriate for previously stored contents, such as video on demand (VOD) data. On the other hand, if a method is focused on the VOD data, the FEC may not be adaptively applied in a network environment.

SUMMARY OF THE INVENTION

Aspects of the present invention provide a method and apparatus for transmitting an image frame adaptively error-corrected by dividing an input image into intra and inter prediction frames, applying different error resilience algorithms to the intra and inter prediction frames, and performing forward error correction (FEC) on each frame.

According to an aspect of the present invention, there is provided a method of transmitting a packet-based image frame, the method including dividing an input image into one or more intra prediction frames and one or more inter prediction frames and encoding the intra and inter prediction frames; applying a first error resilience algorithm to the one or more intra prediction frames and applying a second error resilience algorithm to the one or more inter prediction frames; and performing forward error correction (FEC) on the one or more intra prediction frames according to the first error resilience algorithm and on the one or more inter prediction frames according to the second error resilience algorithm.

The first error resilience algorithm may be a flexible macroblock ordering (FMO) method.

The performing of the FEC may include inserting Reed-Solomon (R-S) codes, and the R-S codes are determined according to a number of burst errors of a packet when the frame is transmitted, a transmission bandwidth, and an error rate of the packet.

The second error resilience algorithm may be a data partitioning (DP) method.

The performing of the FEC may include: calculating a motion level of the inter prediction frame; performing the FEC on the inter prediction frame according to the motion level; and performing the FEC on each of the first through third data partitions of a plurality of inter prediction frames.

According to another aspect of the present invention, there is provided an apparatus for transmitting a packet-based image frame, the apparatus including: an image encoder to divide an input image into one or more intra prediction frames and one or more inter prediction frames and to encode the intra and inter prediction frames; a pre processing unit to apply a first error resilience algorithm to the one or more intra prediction frames and to apply a second error resilience algorithm to the one or more inter prediction frames; and a post processing unit to perform forward error correction (FEC) on the one or more intra prediction frames according to the first error resilience algorithm and to the one or more inter prediction frames according to the second error resilience algorithm.

The first error resilience algorithm of the pre processing unit may be a flexible macroblock ordering (FMO) method.

The post processing unit may insert Reed-Solomon (R-S) codes into the frame received from the pre processing unit and the R-S codes may be determined according to a number of burst errors of a packet when the frame is transmitted, a transmission bandwidth, and an error rate of the packet.

The second error resilience algorithm of the pre processing unit may be a data partitioning (DP) method.

The DP method may include dividing an inter prediction frame into a first data partition that includes a motion vector of the inter prediction frame, a second data partition that includes residual data of intra prediction, and a third data partition that includes residual data of inter prediction.

The post processing unit may include: a motion level classifier to calculate a motion level of the inter prediction frame; a first error correction unit to perform the FEC on the inter prediction frame according to the motion level; and a second error correction unit to perform the FEC on each of the first through third data partitions of a plurality of inter prediction frames.

The motion level classifier may calculate the motion level by using at least one of a number of macroblocks having a non-zero motion vector in the inter prediction frame, an average value of motion vectors of the macroblocks of the inter prediction frame, and a packet size of the inter prediction frame.

The first error correction unit may perform the FEC when the motion level is greater than a predetermined threshold.

The second error correction unit may perform the FEC based on the R-S codes determined by using at least one of a number of frames having larger motion levels than the threshold in the inter prediction frames, an average value of motion vectors of the macroblocks of the inter prediction frames, and a packet size of the inter prediction frames.

The second error correction unit may perform a more intensive FEC on first data partitions of the inter prediction frames.

According to another aspect of the present invention, there is provided a computer readable recording medium having recorded thereon a computer program for executing a method of transmitting a packet-based image frame.

According to still another aspect of the present invention, there is provided a system for transmitting a packet-based image frame, the system including: a transmission terminal to transmit the packet-based image frame, the transmission terminal including: an image encoder to divide an input image into one or more intra prediction frames and one or more inter prediction frames, and to encode the one or more intra prediction frames and the one or more inter prediction frames, a pre processing unit to apply a first error resilience algorithm to the one or more intra prediction frames, and to apply a second error resilience algorithm to the one or more inter prediction frames, and a post processing unit to perform forward error correction (FEC) on the one or more intra prediction frames according to the first error resilience algorithm and the one or more inter prediction frames according to the second error resilience algorithm; and a reception terminal to receive the one or more intra prediction frames and the one or more inter prediction frames, wherein the reception terminal applies a spatial concealment method if an intra prediction frame is not received or is corrupted, and applies a spatial concealment method and/or a temporal concealment method if an inter prediction frame is not received or is corrupted.

According to yet another aspect of the present invention, there is provided a method of transmitting a packet-based image frame, the method including: dividing an input image into one or more intra prediction frames and one or more inter prediction frames and encoding the one or more intra prediction frames and the one or more inter prediction frames; applying a first error resilience algorithm to the one or more intra prediction frames and applying a second error resilience algorithm to the one or more inter prediction frames; performing forward error correction (FEC) on the one or more intra prediction frames according to the first error resilience algorithm and the one or more inter prediction frames according to the second error resilience algorithm; transmitting the one or more intra prediction frames and the one or more inter prediction frames; receiving the one or more intra prediction frames and the one or more inter prediction frames at a reception terminal; and applying a spatial concealment method if an intra prediction frame is not received or is corrupted, and applying a spatial concealment method and/or a temporal concealment method if an inter prediction frame is not received or is corrupted.

According to another aspect of the present invention, there is provided a method of transmitting a packet-based image frame, the method including: dividing an input image into a first frame, having first characteristics, and a second frame, having second characteristics different from the first characteristics, and encoding the first frame and the second frame; applying a first error resilience algorithm to the first frame and applying a second error resilience algorithm to the second frame; and performing forward error correction (FEC) on the first frame according to the first error resilience algorithm and the second frame according to the second error resilience algorithm.

Additional aspects and/or advantages of the invention will be set forth in part in the description which follows and, in part, will be obvious from the description, or may be learned by practice of the invention.

BRIEF DESCRIPTION OF THE DRAWINGS

These and/or other aspects and advantages of the invention will become apparent and more readily appreciated from the following description of the embodiments, taken in conjunction with the accompanying drawings of which.

DETAILED DESCRIPTION OF THE EMBODIMENTS

Figure 1:
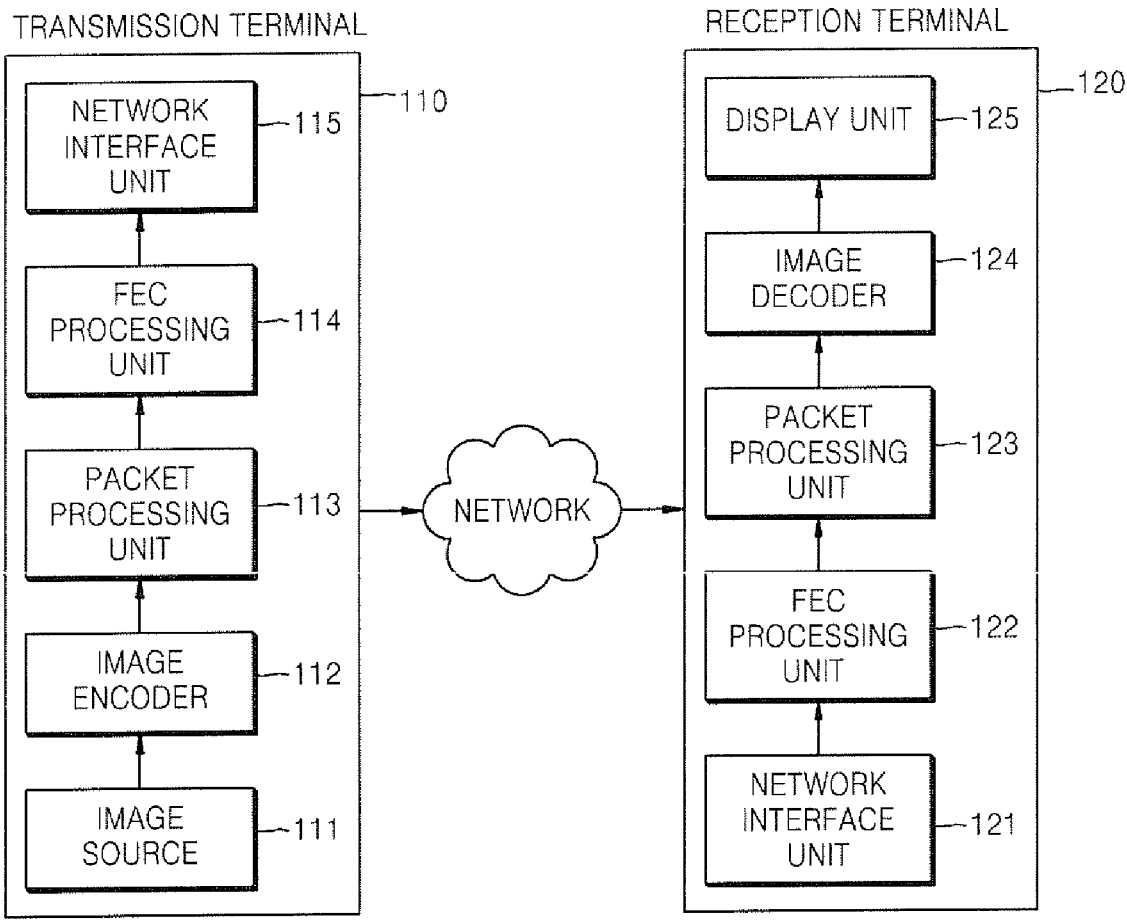
FIG. 1 is a diagram illustrating a conventional method of transmitting an image frame.

Reference will now be made in detail to the present embodiments of the present invention, examples of which are illustrated in the accompanying drawings, wherein like reference numerals refer to the like elements throughout. The embodiments are described below in order to explain the present invention by referring to the figures.

Figure 2:
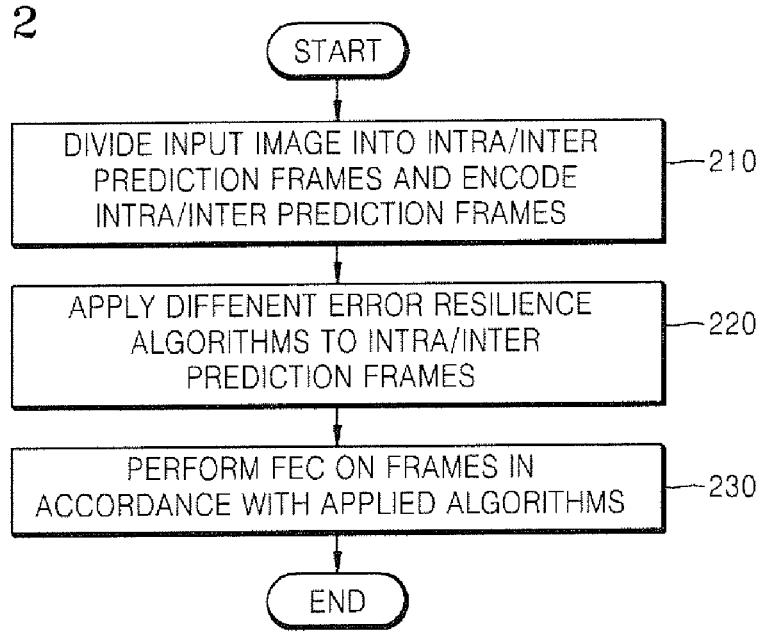
FIG. 2 is a flowchart illustrating a method of transmitting a packet-based image frame according to an embodiment of the present invention.

FIG. 2 is a flowchart illustrating a method of transmitting a packet-based image frame, according to an embodiment of the present invention. Referring to FIG. 2, an input image is divided into intra prediction frames and inter prediction frames. The intra prediction frames and the inter prediction frames are encoded in operation 210. Then, different error resilience algorithms are applied to the intra prediction frames and the inter prediction frames in operation 220. Next, forward error correction (FEC) is performed on the frames according to the applied error resilience algorithms in operation 230. In more detail, the above-described error resilience algorithms used in H.264 technology are applied according to the type of image data and whether the image data is an intra prediction frame or an inter prediction frame. Also, the FEC is performed on the intra prediction frames and the inter prediction frames by being optimized for each frame in consideration of different characteristics of the intra prediction frames and the inter prediction frames. Applying an error resilience algorithm to and performing the FEC on each intra prediction frame and inter prediction frame will now be described.

Figure 3:
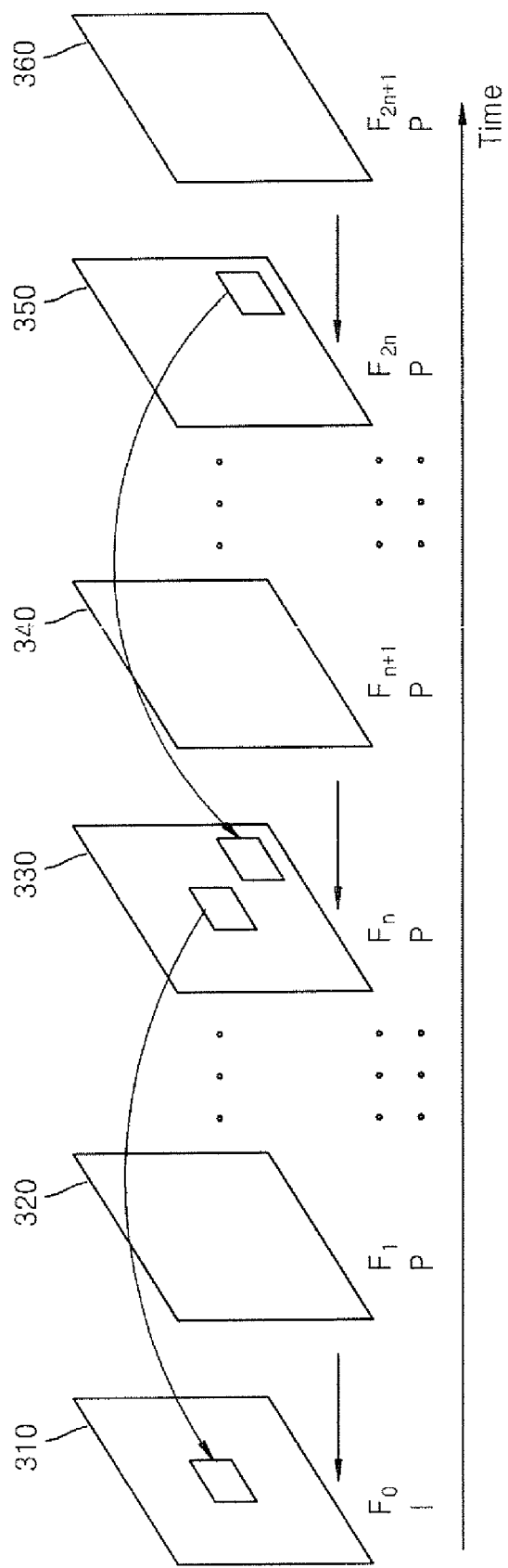
FIG. 3 is a diagram illustrating P frames periodically including reference macroblocks according to an embodiment of the present invention.

FIG. 3 is a diagram illustrating P frames periodically including reference macroblocks according to an embodiment of the present invention. According to aspects of the present invention, an intra prediction frame may be an I frame and an inter prediction frame may be a P frame or a B frame, although not limited thereto. However, for convenience of explanation, a case when the inter prediction frame is the P frame will only be described.

In a structure of a group of pictures (GOP) of encoded frames, a plurality of P frames are disposed after an I frame so that an error occurring in a P frame that performs prediction from a previous frame is continuously propagated through other P frames to a next I frame. In order to prevent this problem, a plurality of methods may be used. According to the current embodiment, a method of periodically inserting a predetermined number of intra macroblocks into the P frames, and a method of periodically performing prediction of a predetermined number of macroblocks from frames other than the previous frames are applied.

Referring to FIG. 3, an I frame 310 and a plurality of P frames 320, 330, 340, 350 and 360 are arranged in a sequential order. General P frames 320, 340 and 360 refer to directly previous frames, such as the I frame 310 and other P frames 330 and 350, respectively. On the other hand, the other P frames 330 and 350 refer to other previous frames such as the I frame 310 and the P frame 330, respectively.

Figure 4:
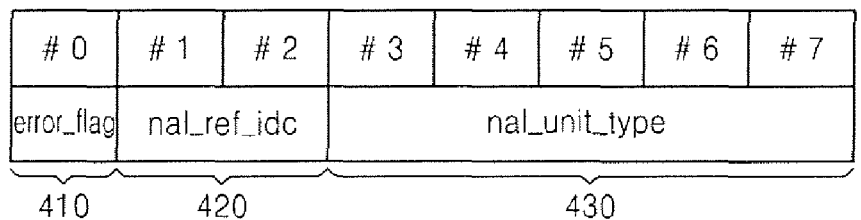
FIG. 4 is a diagram illustrating a data structure of a header of a network abstraction layer (NAL) according to an embodiment of the present invention.

FIG. 4 is a diagram illustrating a data structure of a header of a network abstraction layer (NAL) according to an embodiment of the present invention. In an NAL unit, a header of 1 byte exists, as illustrated in FIG. 4.

Referring to FIG. 4, an error_flag 410 is a bit for checking the NAL unit and must always be 0.

A nal_ref_idc 420 is a field to which a priority of the NAL unit is given. For example, the priority of the NAL unit may be given in accordance with the importance of the NAL unit. The nal_ref_idc 420 of an important NAL (such as a sequence parameter set (SPS) or a picture parameter set (PPS)) may be set to, for example, "b11," which could represent a highest priority. The nal_ref_idc 420 of an NAL such as an Instantaneous Decoder Refresh (IDR) (I-frame) and a first data partition (so-called data partitioning A) to be described later may be set to, for example, "b10." Moreover, the nal_ref_idc 420 of an NAL such as a second data partition (so-called data partitioning B) or a third data partition (so-called data partitioning C) to be described later may be set to, for example, "b01." Therefore, the priority of the NAL may be represented.

A nal_unit_type 430 is a field that represents a type of the NAL and values defined by the H.264 standard are used. For example, an IDR is 5 and first through third data partitions are 2, 3, and 4, respectively.

As described above, the type of data may be represented only by analyzing the header of the NAL.

Figure 5:
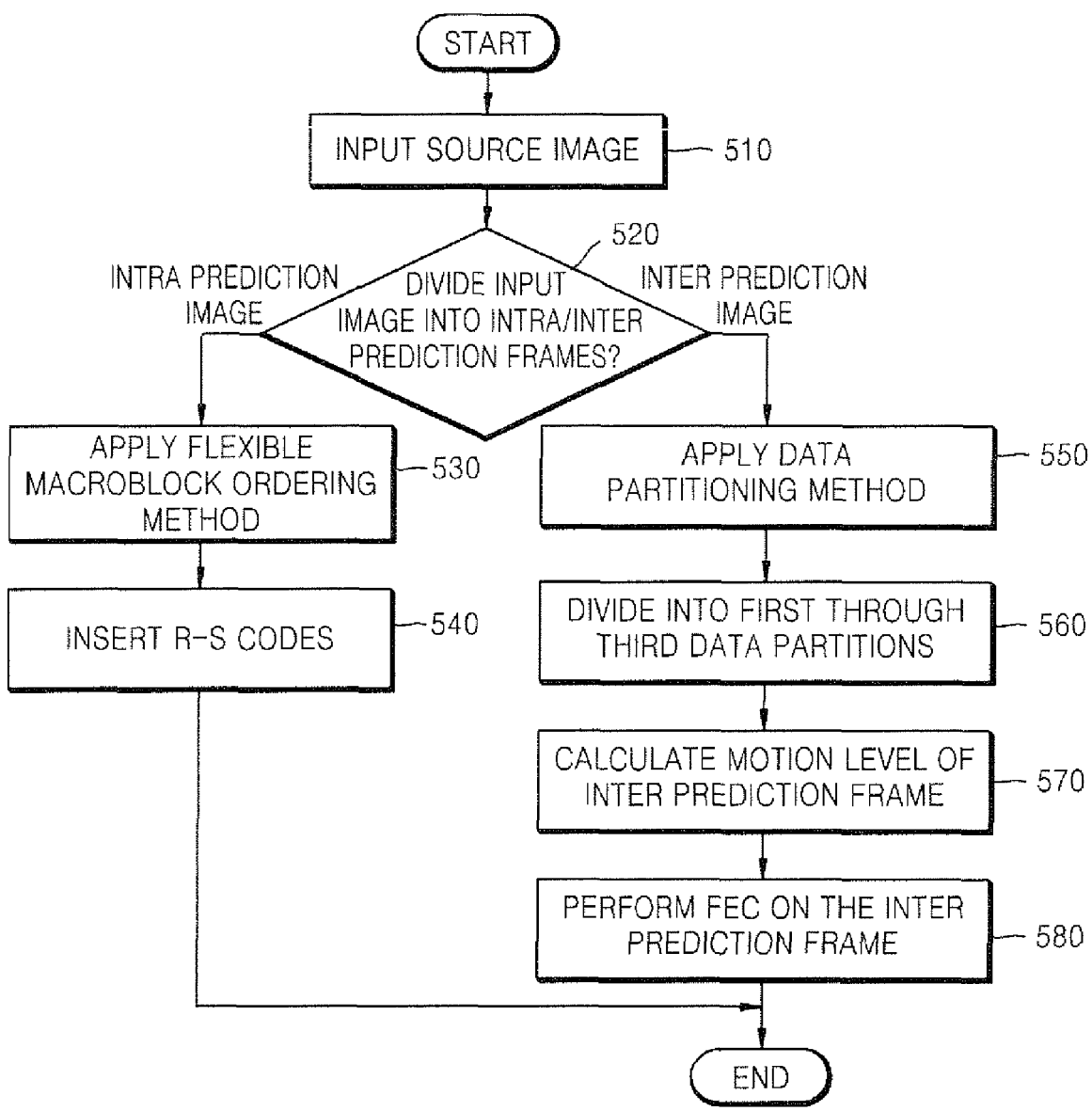
FIG. 5 is a flowchart illustrating a detailed method of transmitting a packet-based image frame according to an embodiment of the present invention.

FIG. 5 is a flowchart illustrating a detailed method of transmitting a packet-based image frame according to an embodiment of the present invention. Referring to FIG. 5, after a source image is input in operation 510, whether to encode the input image by using an intra prediction method or an inter prediction method is determined in operation 520.

An I frame is generated by independently encoding a frame regardless of previous or following frames. That is, prediction coding from another reference image is not performed on the I frame. Accordingly, image transmission and error concealment of the I frame should be performed in consideration of the fact that the I frame is encoded by using information in only one frame. An algorithm that can reflect this fact in H.264 technology is a flexible macroblock ordering (FMO) method. In the FMO method, an image is coded by dividing the image into a plurality of pieces in macroblock units. Thus, if the image is divided in consideration of correlations between the image pieces, when an error occurs, the error may be easily concealed. The I frame may be divided into a large number of pieces in order to be suitable for a maximum transmission unit (MTU) due to a large amount of data in the I frame. By using the FMO method, a frame can be divided into, for example, a maximum of eight slice groups. If the data size of a group from among the eight groups is greater than the MTU, slices may be re-divided by restricting the number of macroblocks per slice. In H.264 technology, the divided data is coded into an NAL unit and the coded NAL is transmitted to a network through a real-time transport protocol (RTP) packet.

Since prediction coding is performed on a P frame by using a difference between a previous image and a current image, a motion vector is an important element for the P frame. An algorithm that can reflect the above-mentioned feature in H.264 technology is a data partitioning (DP) method. If the DP method is applied, a frame is divided into three NAL units. In more detail, the frame is divided into a first data partition that includes a motion vector and other header information, a second data partition that includes residual data of an intra macroblock, and a third data partition that includes residual data of an inter macroblock.

Accordingly, if it is determined that the input image is to be encoded as an intra prediction frame (such as the I frame) in operation 520, the FMO method is applied as an error resilience algorithm for pre processing in operation 530. When the FMO method is applied, the I frame is divided into, for example, eight (k=7) slices. Then, Reed-Solomon (R-S) codes are inserted so as to perform FEC in operation 540. A result of applying the FMO and inserting the R-S codes into the intra prediction frame as described above will be described later with reference to FIGS. 6 and 7.

The R-S codes suggested by Irving S. Reed and G. Solomon are one of non-binary Bose, Ray-Chaudhuri, Hocquenghem (BCH) codes. R-S (n, k, t)=R-S (204, 188, 8) represents that an error of t=8 bytes is completely corrected if input data of k=188 bytes is transmitted by adding data of n−k=16 bytes. An R-S code method performs burst error correction and is widely applied for error correction of a mobile communication system, a spread spectrum system, and a digital storage medium such as memory. Also, the R-S code method is an FEC algorithm adopted as a transmission standard for digital video broadcasting (DVB). The R-S codes are determined in accordance with the number of burst errors of a packet when the frame is transmitted, a transmission bandwidth, and/or an error rate of the packet.

Meanwhile, if it is determined that the input image is to be encoded as an inter prediction frame (such as the P frame) in operation 520, the DP method is applied as an error resilience algorithm in operation 550. Accordingly, in operation 560, the P frame is divided into the first data partition that includes the motion vector and other header information, the second data partition that includes the residual data of the intra macroblock, and the third data partition that includes the residual data of the inter macroblock, as described above.

In order to perform FEC on the inter prediction frame, a motion level of the corresponding P frame is calculated in operation 570. The calculation of the motion level is performed because the P frame is obtained by using an inter frame prediction encoding method based on motion estimation. Accordingly, information on the motion vector is relevant. With regard to the motion level, when a frame loses data, a frame having a small motion level may easily conceal an error, thus hiding the error from a user. However, a frame having a large motion level may not easily conceal an error. Thus, adaptive encoding in accordance with the motion level may be enabled by calculating the motion level and using the motion level for a next operation (i.e., the error correction).

A difference between a previous frame and a current frame is calculated in order to perform motion prediction according to a conventional method. Aspects of the present invention, however, provide a method of performing motion prediction based on a number of macroblocks having a non-zero motion vector, an average value of motion vectors of the macroblocks of the P frame, and/or a packet size of the P frame. Since the number of macroblocks having a non-zero motion vector, the average value of the motion vectors of the macroblocks of the P frame, and the packet size of the P frame are automatically calculated during encoding and an additional calculation is not required (as in the conventional method), the complexity of the algorithm is reduced as compared to the conventional method.

Then, the FEC is performed on the P frame in operation 580. A network channel has a high error rate and thus a transmission packet may be easily lost in the network channel. In general, error protection is performed on physical (PHY) and medium-access control (MAC) layers. However, the error protection has to be further strengthened for a video stream in which data retransmission is not performed and error propagation of a lost packet frequently occurs.

Accordingly, the FEC is performed on the P frame and the FEC is again performed on each of the first through third data partitions. The above operations are performed on a plurality of P frames.

Figure 6:
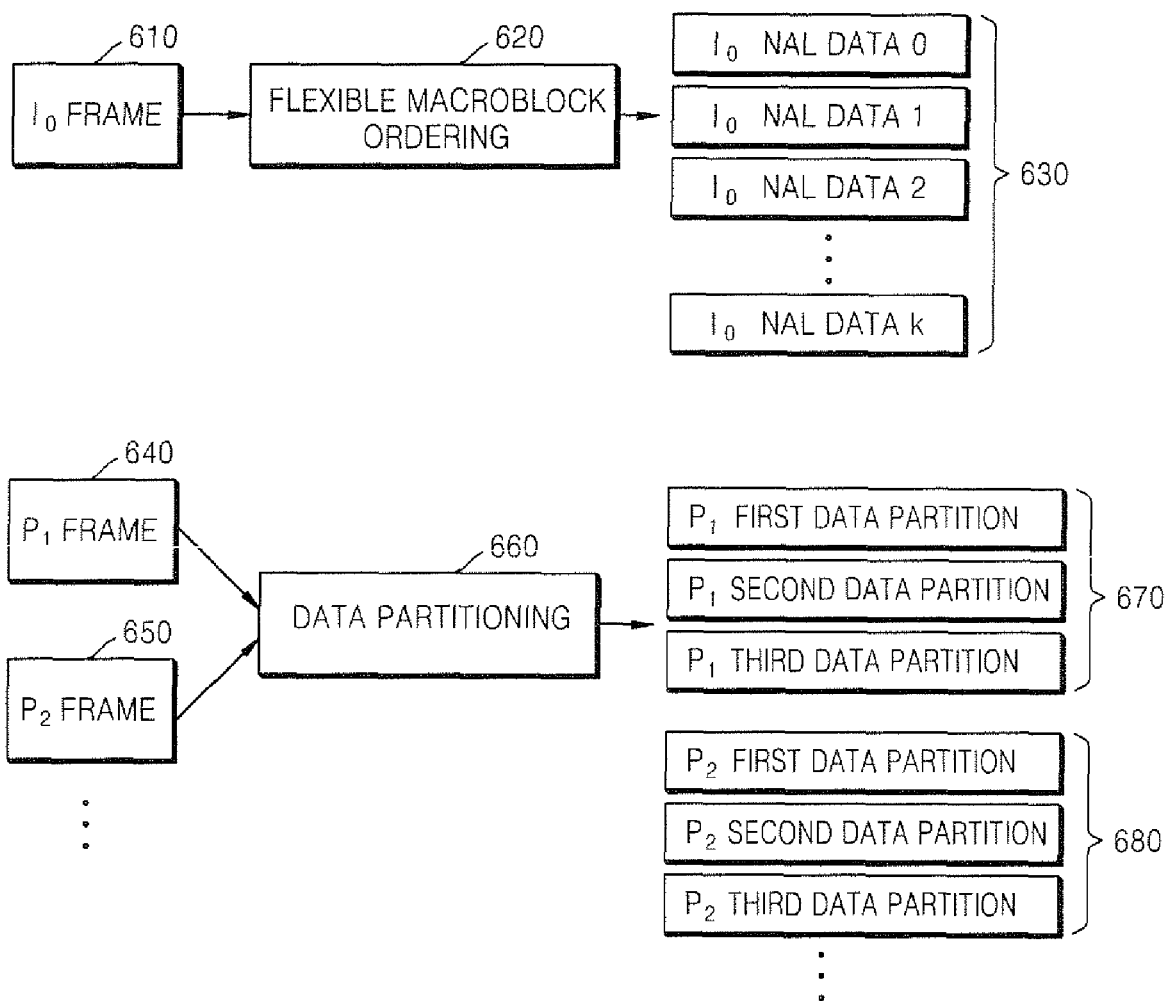
FIG. 6 is a diagram illustrating an example of when an error resilience algorithm is applied to I and P frames according to an embodiment of the present invention.

FIG. 6 is a diagram illustrating an example of when an error resilience algorithm is applied to I and P frames according to an embodiment of the present invention. As described above, frames are divided into I frames and P frames and FEC is variably performed thereto according to aspects of the present invention. An I frame 610 is encoded by using an FMO method 620 and is divided into, for example, eight (k=7) groups, thereby generating multiple NAL data packets 630. Accordingly, the I frame 610 is FEC encoded by using an R-S (n,8) method. Here, n may be a value that can be differently applied in accordance with a network environment. For example, if network information is to be fed back so as to be used, n is 9 when an error does not occur, and n is greater than 9 when many errors occur. In general, n is determined according to a number of burst errors of a packet and a packet error rate of the network. The maximum n can be is determined according to a transmission bandwidth.

P frames 640 and 650 have a smaller packet size than the I frame 610 and have different image properties of packets. The P frames 640 and 650 are respectively divided into first through third data partitions 670 and 680. Then, the FEC is performed on each data partition.

Figure 7:
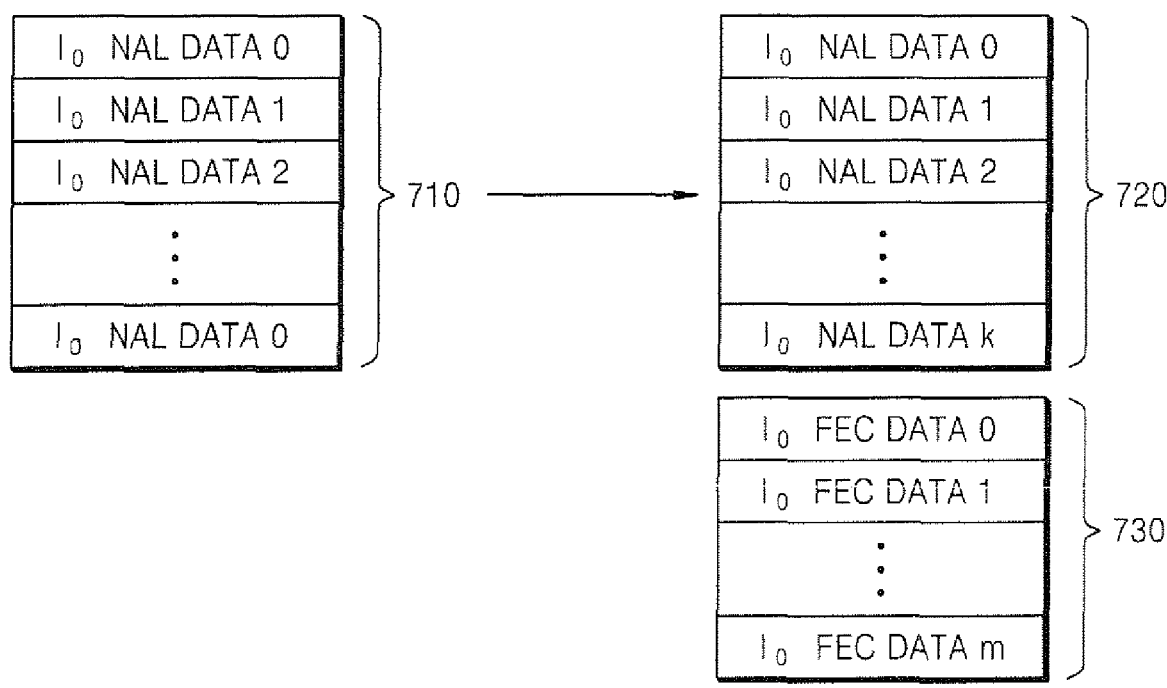
FIG. 7 is a diagram illustrating an example of when forward error correction (FEC) is performed on an I frame according to an embodiment of the present invention.

FIG. 7 is a diagram illustrating an example of when FEC is performed on an I frame according to an embodiment of the present invention. Referring to FIG. 7, R-S codes 730 are inserted into NAL data 710 divided into eight sub-slices for FEC as illustrated by reference numerals 720 and 730. The number of inserted R-S codes 730 is m+1, where m=n−k−1.

Figure 8:
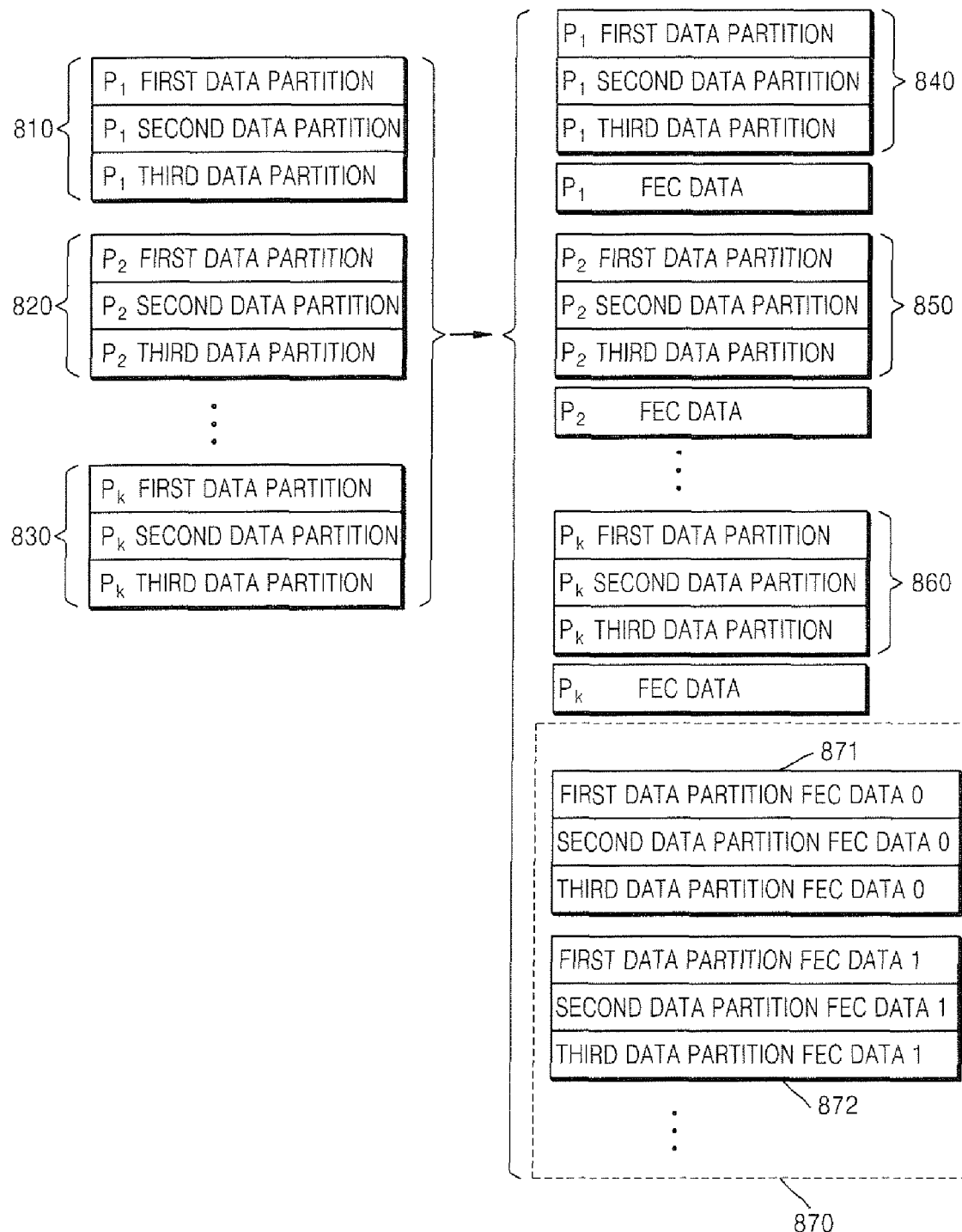
FIG. 8 is a diagram illustrating an example of when FEC is performed on P frames according to an embodiment of the present invention.

FIG. 8 is a diagram illustrating an example of when FEC is performed on P frames 810, 820 and 830 according to an embodiment of the present invention. Referring to FIG. 8, for post processing, FEC is performed appropriately for each data partition by calculating motion levels and using the motion levels so as to generate FEC data 870 for each data partition. In more detail, FEC is primarily performed on each of the P frames 810, 820 and 830 according to the calculated motion levels so as to generate the FEC data 870 that is added to each of the P frames 840, 850 and 860. Then, the FEC is secondarily performed on each of the first through third data partitions of the P frames 840, 850 and 860. It is understood that, according to other aspects of the present invention, the primary and secondary FEC may be performed in an inverse order. The maximum length of R-S codes 871 and 872 may be previously determined in accordance with a buffer size of a reception terminal.

Figure 9:
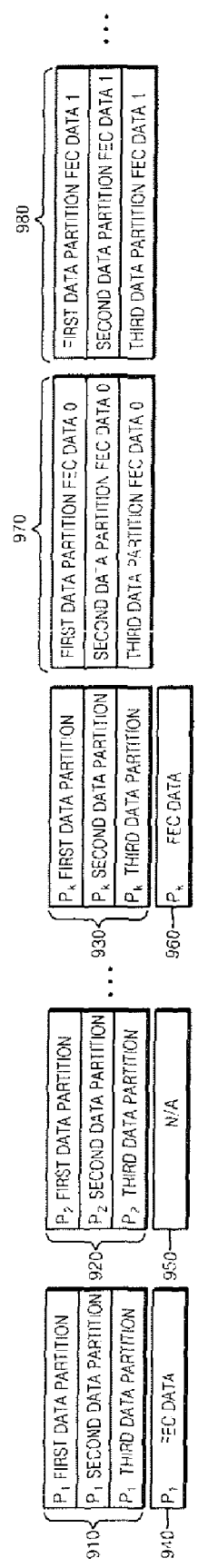
FIG. 9 is a diagram illustrating an example of when FEC is performed on P frames according to another embodiment of the present invention.

FIG. 9 is a diagram illustrating an example of when FEC is performed on P frames 910, 920 and 930 according to another embodiment of the present invention. Referring to FIG. 9, if the motion level of each of the P frames 910, 920 and 930 is greater than a threshold value, the FEC is performed by an exclusive or (XOR) method, as illustrated by reference numerals 940 and 960. In contrast, if the motion level of each of the P frames 910, 920 and 930 is smaller than the threshold value, the FEC is not performed, as illustrated by reference numeral 950. Furthermore, if each data partition includes a large number of frames having large motion levels, the FEC on each data partition may be strengthened. In contrast, if the data partition includes a small number of frames having large motion levels, the FEC may be reduced. Such cases are illustrated by reference numerals 970 and 980 by using an R-S (n,k) method. Whether to strengthen or reduce the FEC can also be determined, for example, by an average value of motion vectors of macroblocks in the frames and/or a packet size of the frames.

Meanwhile, the FEC may be more focused on a first data partition having a highest priority because the first data partition has an important motion vector for the P frame. Conversely, the FEC may be reduced on second and third partitions having relatively lower priorities.

Figure 10:
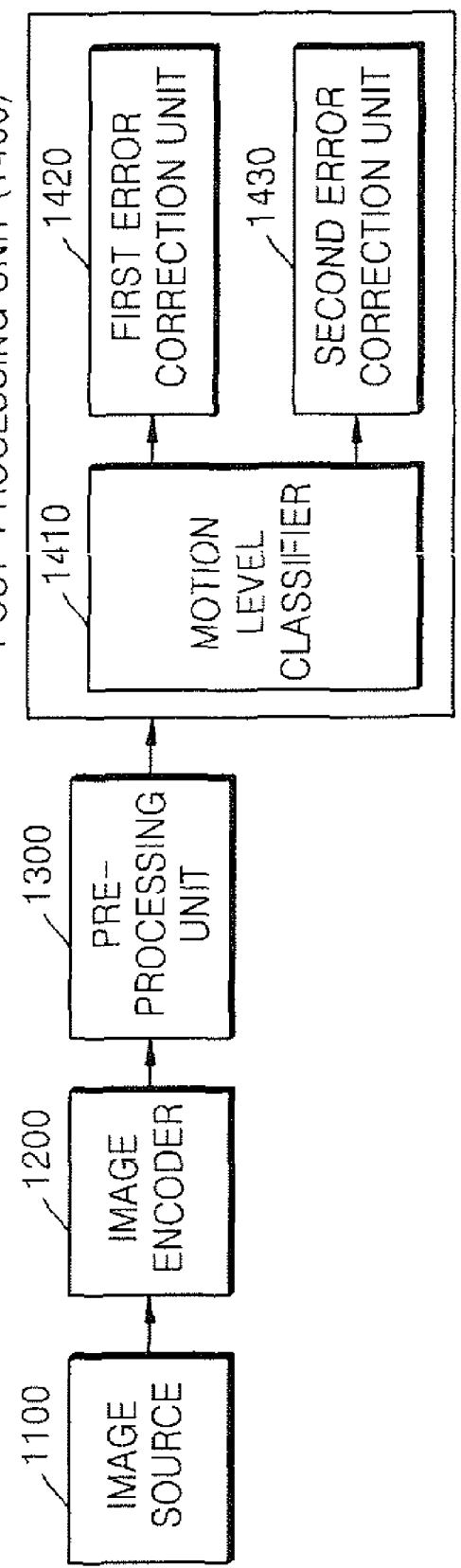
FIG. 10 is a block diagram illustrating an apparatus for transmitting a packet-based image frame according to an embodiment of the present invention.

FIG. 10 is a block diagram illustrating an apparatus for transmitting a packet-based image frame according to an embodiment of the present invention. Referring FIG. 10, the apparatus includes an image source 1100, an image encoder 1200, a pre processing unit 1300, and a post processing unit 1400. The image encoder 1200 divides an input image into intra prediction frames (such as I frames) and inter prediction frames (such as P frames) and encodes the intra prediction frames and the inter prediction frames. The pre processing unit 1300 applies different error resilience algorithms to the intra prediction frames and the inter prediction frames. The post processing unit 1400 performs FEC on the intra prediction frames and the inter prediction frames received from the pre processing unit 1300.

The post processing unit 1400 may include a motion level classifier 1410 that calculates motion levels of the inter prediction frames, a first error correction unit 1420 that performs the FEC on the inter prediction frames according to the motion levels, and a second error correction unit 1430 that performs the FEC on each data partition of the inter prediction frames.

A real-time encoding system includes the image encoder 1200 while a video on demand (VOD) system that uses previously encoded data may not include or use the image encoder 1200. In this case, if sufficient performance of a transmission terminal system is assured in accordance with the calculation, the motion level classifier 1410 may calculate the motion of a corresponding input image frame from a compressed and encoded image.

Packet-based data transmitted by the above-described apparatus is decoded in an inverse order of the transmission by a reception terminal. For an error concealment method of a video reception terminal system, a spatial concealment method may be used when an I frame in which packets divided by an FMO method loses one or more packets, and a spatial concealment method and/or a temporal concealment method may be appropriately combined and used when a P frame loses a motion vector.

Aspects of the present invention can also be embodied as computer-readable codes on a computer-readable recording medium. The computer-readable recording medium is any data storage device that can store data that can be thereafter read by a computer system. Examples of the computer-readable recording medium include read-only memory (ROM), random-access memory (RAM), CD-ROMs, magnetic tapes, floppy disks, optical data storage devices, and a computer data signal embodied in a carrier wave comprising a compression source code segment comprising the code and an encryption source code segment comprising the code (such as data transmission through the Internet). The computer-readable recording medium can also be distributed over network-coupled computer systems so that the computer-readable code is stored and executed in a distributed fashion. Aspects of the present invention may also be realized as a data signal embodied in a carrier wave and comprising a program readable by a computer and transmittable over the internet.

As described above, in a method and apparatus for transmitting a packet-based image frame according to aspects of the present invention, optimal error correction may be performed in accordance with characteristics of I and P frames when image data is transmitted. Thus, a strong image streaming service for preventing errors of a mobile environment (such as an IP mobile TV) may be implemented more simply and efficiently than a conventional method.

Although a few embodiments of the present invention have been shown and described, it would be appreciated by those skilled in the art that changes may be made in this embodiment without departing from the principles and spirit of the invention, the scope of which is defined in the claims and their equivalents.

What is claimed is:

1. A method of transmitting a packet-based image frame, the method comprising:
    dividing an input image into an intra prediction frame and an inter prediction frame and encoding the intra prediction frame and the inter prediction frame;
    applying a first error resilience algorithm to the intra prediction frame and applying a second error resilience algorithm to the inter prediction frame; and
    performing forward error correction (FEC) on the intra prediction frame according to the first error resilience algorithm and the inter prediction frame according to the second error resilience algorithm,
    wherein the second error resilience algorithm is a data partitioning (DP) method,
    wherein the DP method comprises dividing the inter prediction frame into a first data partition that includes a motion vector of the inter prediction frame, a second data partition that includes residual data of an intra macroblock, and a third data partition that includes residual data of an inter macroblock, and
    wherein the performing of the FEC on the inter prediction frame comprises:
        calculating a motion level of the inter prediction frame;
        performing the FEC on the inter prediction frame according to the corresponding calculated motion level; and performing the FEC on each of the first data partition, the second data partition, and the third data partition of a plurality of inter prediction frames.

2. The method as claimed in claim 1, wherein the first error resilience algorithm is a flexible macroblock ordering (FMO) method.

3. The method as claimed in claim 2, wherein the performing of the FEC on the intra prediction frame comprises inserting Reed-Solomon (R-S) codes into the intra prediction frame.

4. The method as claimed in claim 3, wherein the R-S codes are determined according to at least one of a number of burst errors of a packet when the intra prediction frame is transmitted, a transmission bandwidth, and an error rate of the packet.

5. The method as claimed in claim 1, wherein the motion level is calculated by using at least one of a number of macroblocks having a non-zero motion vector in the inter prediction frame, an average value of motion vectors of macroblocks of the inter prediction frame, and a packet size of the inter prediction frame.

6. The method as claimed in claim 5, wherein the FEC is performed on a first inter prediction frame having a motion level greater than or equal to a predetermined threshold, and the FEC is not performed on a second inter prediction frame having a motion level less than the predetermined threshold.

7. The method as claimed in claim 5, wherein the performing of the FEC on each of the first data partition, the second data partition, and the third data partition of a plurality of inter prediction frames comprises inserting R-S codes determined according to one or more of a number of frames having a motion level greater than a threshold, the average value of motion vectors of the macroblocks of the inter prediction frames, and the packet size of the inter prediction frames.

8. The method as claimed in claim 1, wherein the performing of the FEC on each of the first data partition, the second data partition, and the third data partition of the inter prediction frame comprises performing a more intensive FEC on the first data partition, as compared to the second data partition and the third data partition, of the inter prediction frame.

9. An apparatus for transmitting a packet-based image frame, the apparatus comprising:
an image encoder to divide an input image into an intra prediction frame and an inter prediction frame, and to encode the intra prediction frame and the inter prediction frame;
a pre processing unit to apply a first error resilience algorithm to the intra prediction frame, and to apply a second error resilience algorithm to the inter prediction frame; and
a post processing unit to perform forward error correction (FEC) on the intra prediction frame according to the first error resilience algorithm and the inter prediction frame according to the second error resilience algorithm,
wherein the second error resilience algorithm of the pre processing unit is a data partitioning (DP) method,
wherein the DP method comprises dividing the inter prediction frame into a first data partition that includes a motion vector of the inter prediction frame, a second data partition that includes residual data of an intra macroblock, and a third data partition that includes residual data of an inter macroblock, and
wherein the post processing unit comprises:
a motion level classifier to calculate a motion level of the inter prediction frame;
a first error correction unit to perform the FEC on the inter prediction frame according to the corresponding calculated motion level; and
a second error correction unit to perform the FEC on each of the first data partition, the second data partition, and the third data partition of a plurality of inter prediction frames.

10. The apparatus as claimed in claim 9, wherein the first error resilience algorithm of the pre processing unit is a flexible macroblock ordering (FMO) method.

11. The apparatus as claimed in claim 10, wherein the post processing unit inserts Reed-Solomon (R-S) codes into the intra prediction frame.

12. The apparatus as claimed in claim 11, wherein the R-S codes are determined according to at least one of a number of burst errors of a packet when the intra prediction frame is transmitted, a transmission bandwidth, and an error rate of the packet.

13. The apparatus as claimed in claim 9, wherein the motion level classifier calculates the motion level by using at least of a number of macroblocks having a non-zero motion vector in the inter prediction frame, an average value of motion vectors of macroblocks of the inter prediction frame, and a packet size of the inter prediction frame.

14. The apparatus as claimed in claim 13, wherein the first error correction unit performs the FEC on a first inter prediction frame having a motion level greater than or equal to a predetermined threshold, and does not perform the FEC on a second inter prediction frame having a motion level less than the predetermined threshold.

15. The apparatus as claimed in claim 13, wherein the second error correction unit performs the FEC on each of the first data partition, the second data partition, and the third data partition of a plurality of inter prediction frames based on R-S codes determined by using at least one of a number of frames having a motion level greater than a threshold, an average value of motion vectors of macroblocks of the inter prediction frames, and a packet size of the inter prediction frames.

16. The apparatus as claimed in claim 9, wherein the second error correction unit performs a more intensive FEC on the first data partition, as compared to the second data partition and the third data partition, of the inter prediction frame.

17. A system for transmitting a packet-based image frame, the system comprising:
a transmission terminal to transmit the packet-based image frame, the transmission terminal comprising:
an image encoder to divide an input image into an intra prediction frame and an inter prediction frame, and to encode the intra prediction frame and the inter prediction frame,
a pre processing unit to apply a first error resilience algorithm to the intra prediction frame, and to apply a second error resilience algorithm to the inter prediction frame, and
a post processing unit to perform forward error correction (FEC) on the intra prediction frame according to the first error resilience algorithm and the inter prediction frame according to the second error resilience algorithm; and
a reception terminal to receive the intra prediction frame and the inter prediction frame, wherein the reception terminal applies a spatial concealment method if the intra prediction frame is not received or is corrupted, and applies a spatial concealment method and/or a temporal concealment method if the inter prediction frame is not received or is corrupted,
wherein the second error resilience algorithm of the pre processing unit is a data partitioning (DP) method,
wherein the DP method comprises dividing the inter prediction frame into a first data partition that includes a motion vector of the inter prediction frame, a second data partition that includes residual data of an intra macroblock, and a third data partition that includes residual data of an inter macroblock, and wherein the post processing unit comprises:
- a motion level classifier to calculate a motion level of the inter prediction frame;
- a first error correction unit to perform the FEC on the inter prediction frame according to the corresponding calculated motion level; and
- a second error correction unit to perform the FEC on each of the first data partition, the second data partition, and the third data partition of a plurality of inter prediction frames.

18. The system as claimed in claim 17, wherein the first error resilience algorithm of the pre processing unit is a flexible macroblock ordering (FMO) method.

19. The system as claimed in claim 18, wherein the post processing unit inserts Reed-Solomon (R-S) codes into the intra prediction frame, the R-S codes determined according to at least one of a number of burst errors of a packet when the intra prediction frame is transmitted, a transmission bandwidth, and an error rate of the packet.

* * * * *